United States Patent
Xu et al.

(10) Patent No.: US 7,838,375 B1
(45) Date of Patent: Nov. 23, 2010

(54) SYSTEM AND METHOD FOR PROVIDING A POLYEMIT MODULE FOR A SELF ALIGNED HETEROJUNCTION BIPOLAR TRANSISTOR ARCHITECTURE

(75) Inventors: Mingwei Xu, South Portland, ME (US); Jamal Ramdani, Scarborough, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 192 days.

(21) Appl. No.: 11/807,215

(22) Filed: May 25, 2007

(51) Int. Cl.
*H01L 21/331* (2006.01)
(52) U.S. Cl. .................. 438/321; 438/312; 438/320; 438/343; 438/349; 438/369; 257/197; 257/198; 257/200
(58) Field of Classification Search .............. 438/312, 438/320, 321, 343, 349, 369; 257/197–198, 257/200
See application file for complete search history.

(56) References Cited

U.S. PATENT DOCUMENTS

| | | | |
|---|---|---|---|
| 5,696,006 A * | 12/1997 | Hirai et al. ........... 438/203 |
| 5,866,462 A | 2/1999 | Tsai et al. |
| 6,043,554 A | 3/2000 | Miwa |
| 6,130,136 A | 10/2000 | Johnson et al. |
| 6,531,369 B1 * | 3/2003 | Ozkan et al. ........... 438/312 |
| 6,559,020 B1 | 5/2003 | Salmi |
| 6,740,552 B2 | 5/2004 | Gonzalez et al. |
| 6,780,695 B1 | 8/2004 | Chen et al. |
| 7,002,221 B2 | 2/2006 | Khater et al. |
| 7,018,778 B1 | 3/2006 | Leibiger et al. |
| 7,494,887 B1 | 2/2009 | Hussain |
| 2001/0017399 A1 * | 8/2001 | Oda et al. ............ 257/565 |
| 2002/0053711 A1 * | 5/2002 | Chau et al. ........... 257/412 |
| 2003/0045066 A1 | 3/2003 | Igarashi |
| 2005/0142787 A1 | 6/2005 | Ko |
| 2005/0184359 A1 | 8/2005 | Akatsu et al. |
| 2006/0054595 A1 | 3/2006 | Starzynski |
| 2006/0249814 A1 | 11/2006 | Greenberg et al. |
| 2007/0001264 A1 | 1/2007 | Sheridan et al. |
| 2007/0134854 A1 * | 6/2007 | Zhang et al. ........... 438/142 |

OTHER PUBLICATIONS

P. Chevalier, et al., "230 Ghz self-aligned SiGeC HBT for 90 nm BiCMOS technology", 2004 IEEE, p. 225-228.
D. Nguyen-Ngoc et al., "A 200 mm SiGe-HBT BiCMOS Technology for Mixed Signal Applications," 1995 IEEE, BCTM95 Process Technology, pp. 89-92.
Yousuke Yamamoto et al., "SDX: A Novel Self-Aligned Technique and Its Application to High-Speed Bipolar LSI's," IEEE Transactions on Electron Devices, vol. 35, No. 10, Oct. 1988, pp. 1601-1608.

(Continued)

*Primary Examiner*—Ha Tran T Nguyen
*Assistant Examiner*—Karen M Kusumakar

(57) ABSTRACT

A system and method are disclosed for providing an improved polyemit module for a self aligned heterojunction bipolar transistor architecture. The polyemit module of the transistor of the present invention is formed using a double layer deposition process. In the double layer deposition process, the first layer is a layer of emitter polysilicon and the second layer is a sacrificial layer of silicon germanium (SiGe). The shape and thickness of the emitter polysilicon layer of the polyemit module provides (1) a reduction in the overall resistance of the emitter and (2) an increase in the contact area between the emitter polysilicon layer and a contact structure that is more than three times the contact area that is provided in prior art polyemit modules.

20 Claims, 5 Drawing Sheets

OTHER PUBLICATIONS

Bengt Edholm et al., "A Self-Aligned Lateral Bipolar Transistor Realized on SIMOX-Material," IEEE Transactions on Electron Devices, vol. 40, No. 12, Dec. 1993, pp. 2359-2360.

Michihiro Inoue et al., "Self-Aligned Complementary Bipolar Transistors Fabricated with a Selective-Oxidation Mask," IEEE Transactions on Electron Devices, vol. ED-34, No, 10, Oct. 1987, pp. 2146-2152.

D. L. Harame et al., "Si/SiGe Epitaxial-Base Transistors-Part II: Process Integration and Analog Applications," IEEE Transactions on Electron Devices, vol. 42, No. 3, Mar. 1995, pp. 469-482.

Mingwei Xu, et al., "System and Method for Providing a Self Aligned Bipolar Transistor Using a Simplified Sacrificial Nitride Emitter", U.S. Appl. No. 11/803,539, filed May 15, 2007.

Mingwei Xu, et al., "System and Method for Providing a Self Aligned Bipolar Transistor Using a Silicon Nitride Ring", U.S. Patent Appl. No. 11/803,515, filed May 15, 2007.

Mingwei Xu, et al., "System and Method for Providing a Fully Self Aligned Bipolar Transistor Using Modified Cavity Formation to Optimize Selective Epitaxial Growth", U.S. Appl. No. 11/805,417, filed May 23, 2007.

Mingwei Xu, et al., "System and Method for Providing a Self Aligned Bipolar Transistor Using a Sacrificial Polysilicon External Base", U.S. Appl. No. 11/804,597, filed May 18, 2007.

S. Harrison, et al., "Poly-gate Replacement Through Contact Hole (PRETCH): A new method for High-K/Metal gate and multi-oxide implementation on chip", 2004 IEEE, 4 pages.

* cited by examiner

US 7,838,375 B1

SYSTEM AND METHOD FOR PROVIDING A POLYEMIT MODULE FOR A SELF ALIGNED HETEROJUNCTION BIPOLAR TRANSISTOR ARCHITECTURE

TECHNICAL FIELD OF THE INVENTION

The system and method of the present invention is generally directed to the manufacture of integrated circuits and, in particular, to a system and method for providing a polyemit module for a self aligned heterojunction bipolar transistor architecture.

BACKGROUND OF THE INVENTION

Silicon germanium (SiGe) heterojunction bipolar transistors are employed in an increasing number of integrated circuit applications. Development of silicon germanium (SiGe) heterojunction bipolar transistor technology has been very rapid since the first functional silicon germanium (SiGe) heterojunction bipolar transistor was introduced in December 1987. The first silicon germanium (SiGe) heterojunction bipolar transistor technology entered commercial production on 200-mm wafers in 1994.

The technical advantages that are provided by silicon germanium (SiGe) heterojunction bipolar transistor technology continue to be investigated by researchers in the semiconductor industry. There continues to be a need in the art for systems and methods that provide improvements in silicon germanium (SiGe) heterojunction bipolar transistor technology.

The system and method of the present invention provides a self aligned silicon germanium (SiGe) heterojunction bipolar transistor that has an improved polyemit module. The polyemit module of the transistor of the present invention is formed using a double layer deposition process. In the double layer deposition process, the first layer is a layer of emitter polysilicon and the second layer is a sacrificial layer of silicon germanium (SiGe). The shape and thickness of the polysilicon layer of the polyemit module provides (1) a reduction in the overall resistance of the emitter and (2) an increase in the contact area between the emitter polysilicon layer and a contact structure that is more than three times the contact area that is provided in prior art polyemit modules.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
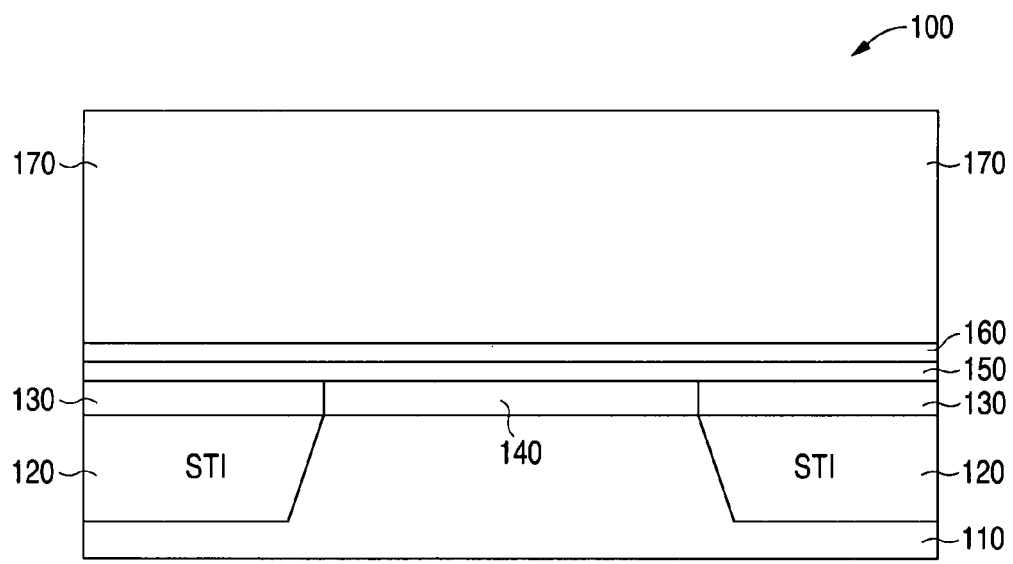
FIG. 1 illustrates a schematic diagram of a cross section of a structure formed during the manufacture of a self aligned heterojunction bipolar transistor comprising a polyemit module of the present invention.

FIGS. 1 through 10, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged integrated circuit device.

To simplify the drawings the reference numerals from previous drawings will sometimes not be repeated for structures that have already been identified. For purposes of clarity of illustration the thickness of the structures will sometimes not be drawn to scale. The values of thickness that are given for the structures of the invention are illustrative. It is understood that other values of thickness for the structures could be used to practice the method of the invention.

FIGS. 1 through 9 illustrate schematic diagrams that show successive key steps in the manufacture of a self aligned heterojunction bipolar transistor comprising a polyemit module of the present invention. FIG. 1 illustrates a schematic diagram of a cross section of a structure 100 that is initially formed during the manufacture of a self aligned heterojunction bipolar transistor comprising a polyemit module of the present invention.

The formation of the structure 100 shown in FIG. 1 is begun with the formation of a collector 110 for the transistor. The collector 110 is located between two shallow trench isolation (STI) structures 120. Then a base 140 is formed over the collector 110. A typical width for the base 140 is five hundred fifty nanometers (550 nm). In one advantageous embodiment the base 140 is formed from silicon germanium carbon (SiGeC) material. Polysilicon base structures 130 are formed on each side of the base 140. The polysilicon base structures 130 are located over the shallow trench isolation (STI) structures 120.

Then a silicon oxide/silicon nitride/silicon oxide (ONO) stack is deposited over the polysilicon base structures 130 and over the base 140. The first layer of the ONO stack is a layer of silicon oxide 150 (e.g., tetraethyloxysilane 150). The second layer of the ONO stack is a layer of silicon nitride 160. The third layer of the ONO stack is a layer of silicon oxide 170 (e.g., tetraethyloxysilane 170).

In one advantageous embodiment of the invention the thicknesses of the layers of the ONO stack are as follows. A thickness of the layer of silicon oxide 150 is approximately twenty nanometers (20 nm). A thickness of the layer of silicon nitride 160 is approximately twenty nanometers (20 nm). A thickness of the layer of silicon oxide 170 is approximately four hundred seventy five nanometers (475 nm).

Figure 2:
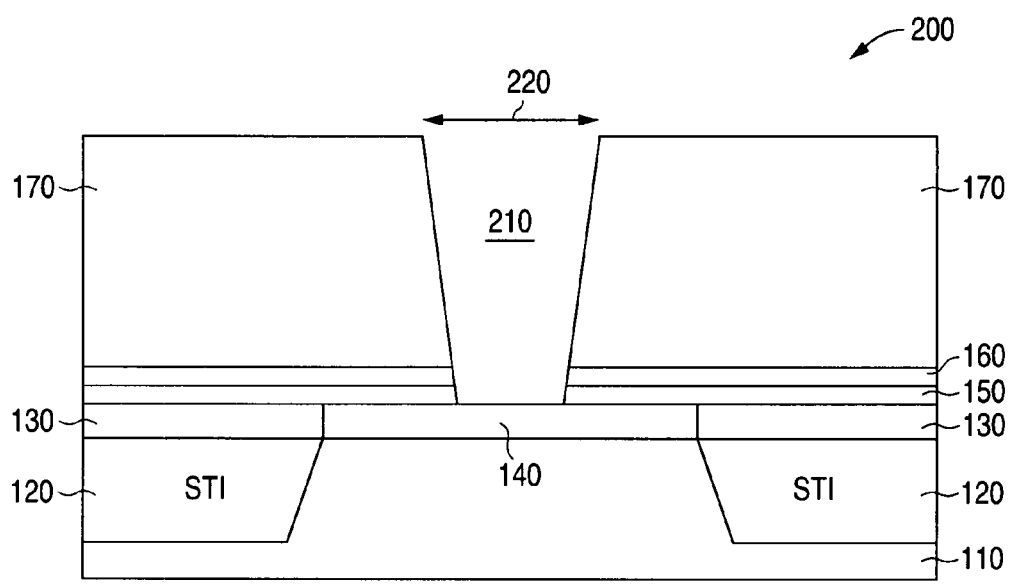
FIGS. 2 through 9 illustrate schematic diagrams that show successive key steps in the manufacture of a self aligned heterojunction bipolar transistor comprising a polyemit module of the present invention.

Then a mask and etch procedure is performed to etch an emitter window 210 though the ONO stack (150, 160, 170) down to the base 140. As shown in FIG. 2, the etch procedure forms an emitter window 210 in which the sides of the emitter window 210 are sloped so that the bottom of the emitter window 210 is more narrow than the top of the emitter window 210.

In an advantageous embodiment of the invention the width 220 of the top of the emitter window 210 ranges from approximately one hundred seventh nanometers (170 nm) to one hundred eighty nanometers (180 nm). In an advantageous embodiment of the invention the width of the bottom of the emitter window 210 is approximately one hundred fifty nanometers (150 nm). These dimensions determine the slope of the walls of the emitter window 210. The resulting structure 200 is shown in FIG. 2.

Then an in-situ doped (ISD) emitter is formed in the emitter window 210 using a double layer deposition process. In the first step of the double layer deposition process a layer of emitter polysilicon 310 is deposited over the structure 200. In an advantageous embodiment of the invention the thickness of the layer of emitter polysilicon 310 is approximately fifty nanometers (50 nm). In an alternate advantageous embodiment of the invention a layer of monocrystalline silicon (not shown) can be used in place of the polysilicon 310.

Figure 3:
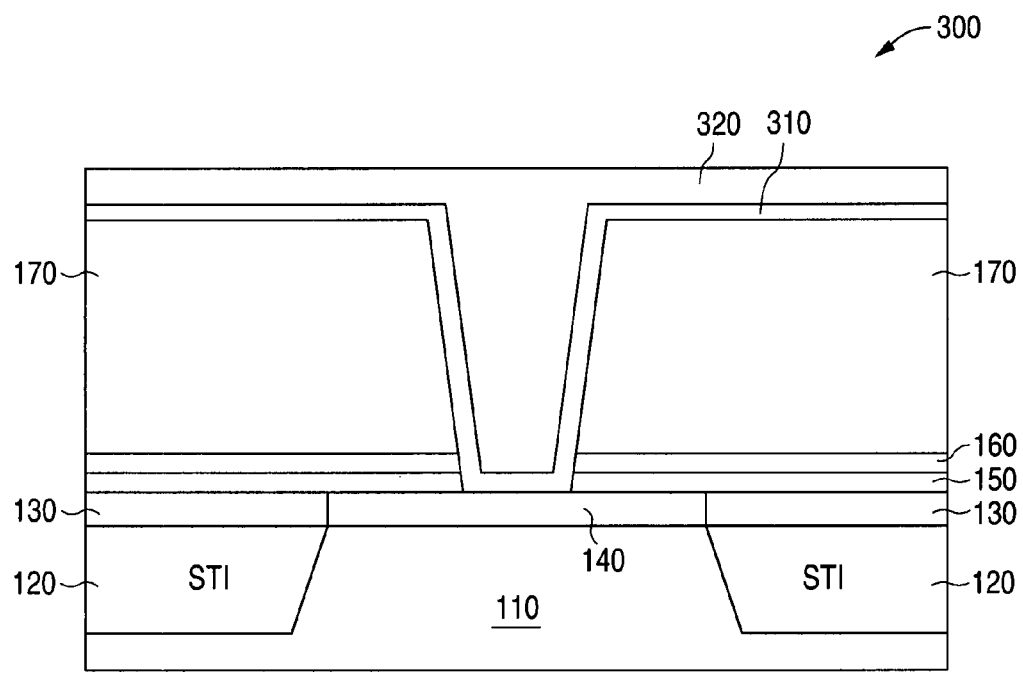

In the second step of the double layer deposition process a layer of silicon germanium (SiGe) 320 is deposited over the layer of emitter polysilicon 310. The layer of silicon germanium (SiGe) 320 completely fills the rest of the volume of the emitter window 210. The layer of silicon germanium (SiGe) 320 extends above the horizontal layer of emitter polysilicon 310 that covers the silicon oxide 170 of the ONO stack. In an advantageous embodiment of the invention the layer of silicon germanium (SiGe) 320 extends above the horizontal layer of emitter polysilicon (SiGe) 320 to a thickness of approximately one hundred eighty nanometers (180 nm). The resulting structure 300 is shown in FIG. 3.

Figure 4:
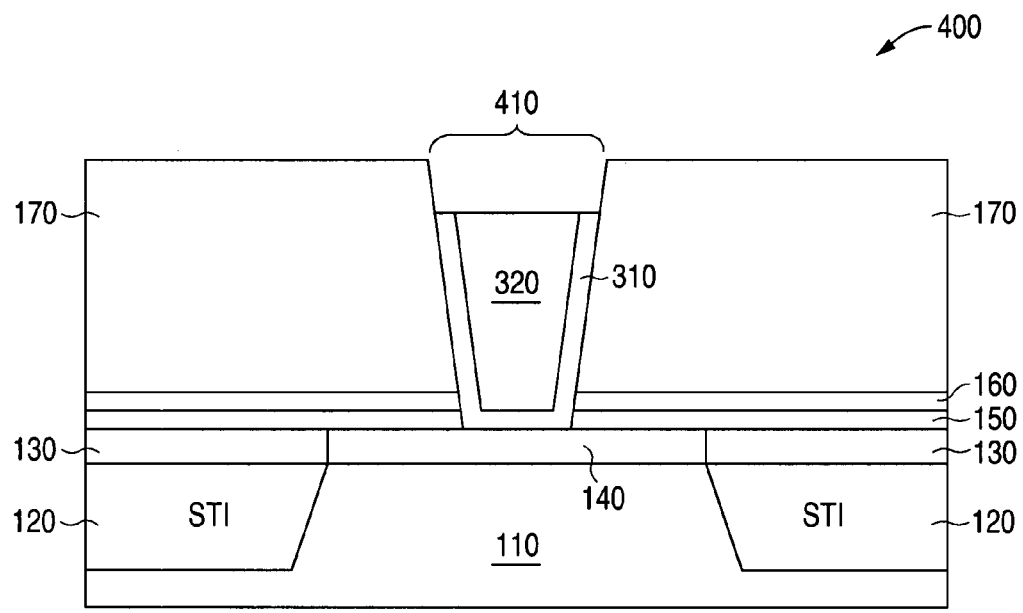

Then an etch procedure is applied to etch away outer portions of the silicon germanium (SiGe) 320 and outer portions of the emitter polysilicon 310. A portion of the silicon germanium (SiGe) 320 and a portion of the emitter polysilicon 310 are also removed from the top of the emitter window 210. The remaining portions of the silicon germanium (SiGe) 320 and of the emitter polysilicon 310 form an emitter 410 as shown in FIG. 4. In an alternate advantageous embodiment of the method of the invention, the portions of the silicon germanium (SiGe) 320 and emitter polysilicon 310 can be removed by a chemical mechanical polishing (CMP) procedure. The resulting structure 400 is shown in FIG. 4. As shown in FIG. 4, the portions of the emitter polysilicon 310 that are adjacent to the walls and bottom of the emitter window 210 form a U-shaped structure.

Figure 5:
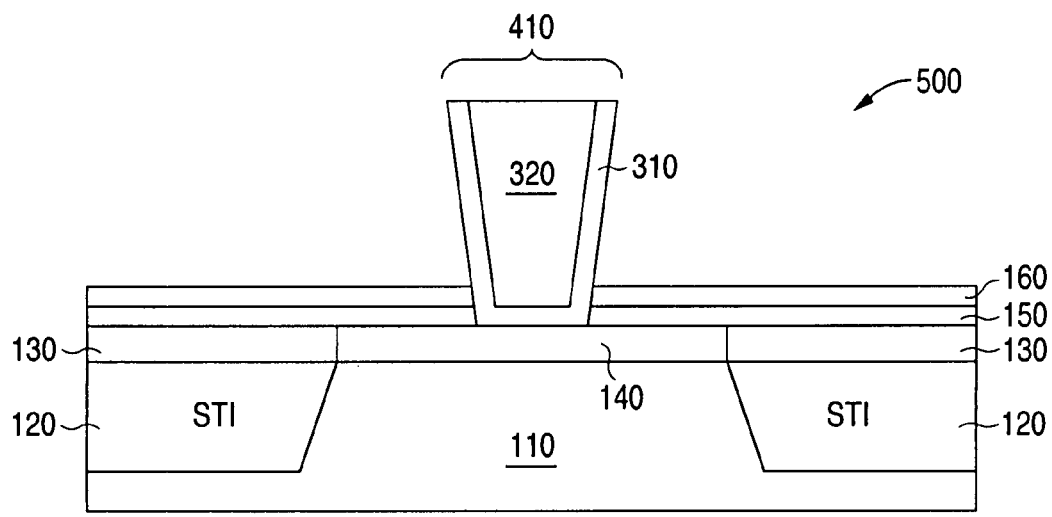
Figure 6:
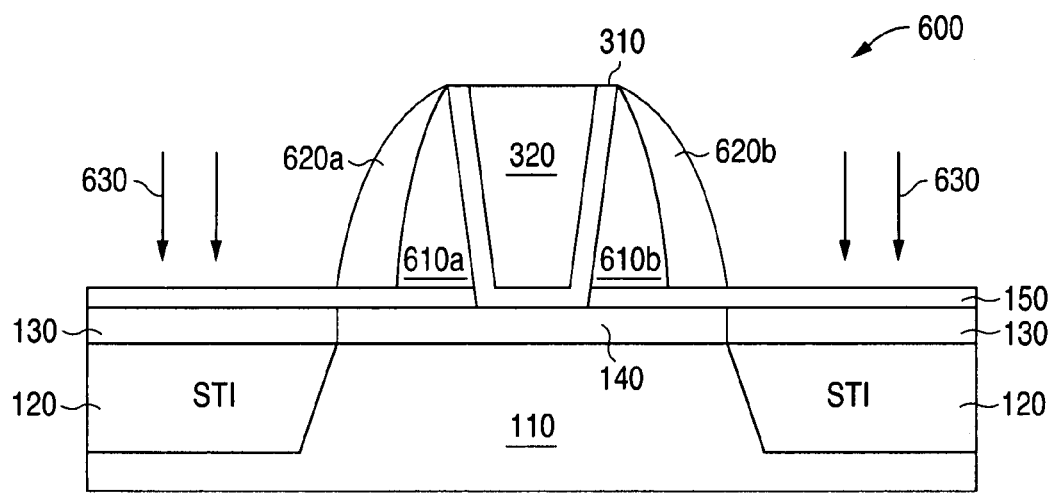
Figure 7:
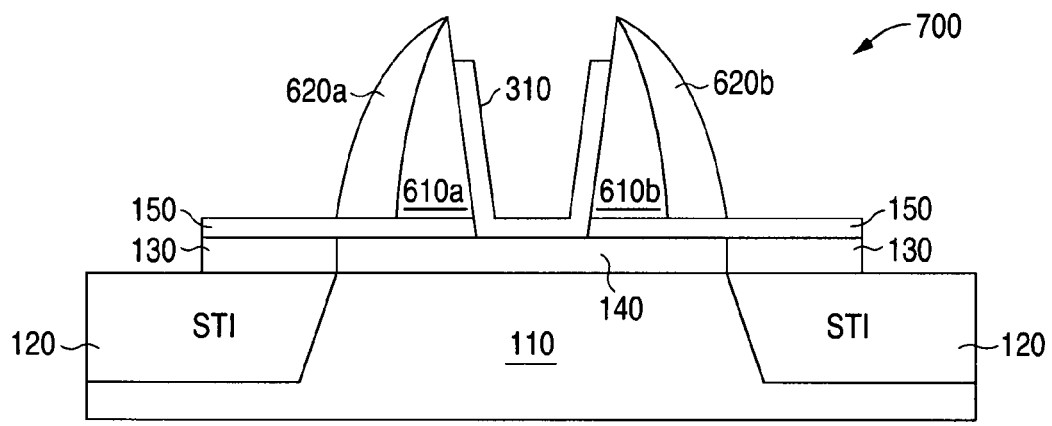

Then an etch procedure is performed to etch away the material of the silicon oxide 170 of the ONO stack. Removing the silicon oxide 170 exposes the emitter 410. The resulting structure 500 is shown in FIG. 5.

Then a layer of silicon nitride 610 is placed over the structure 500. An etch procedure is then applied to etch away portions of the layer of silicon nitride 610 to form first silicon nitride spacers (610a and 610b). Then another layer of silicon nitride 620 is placed over the resulting structure. An etch procedure is then applied to etch away portions of the layer of silicon nitride 620 to form second silicon nitride spacers (620a and 620b). The etch procedure also etches away the remaining portions of the layer of silicon nitride 160 of the ONO stack located over the silicon oxide 150.

Then a boron implant procedure is performed on the polysilicon base structures 130 to form a raised external base. In an advantageous embodiment of the invention the boron implant procedure comprises the implantation of boron ions at a concentration of $2\times10^{14}$ ions/cm$^2$ to $2\times10^{15}$ ions/cm$^2$ at thirty kilo electron Volts (30 keV) to fifty kilo electron Volts (50 keV). The boron implant procedure is represented by arrows 630 in FIG. 6. The result of applying these procedures is shown in the structure 600 in FIG. 6.

Then an etch procedure is performed to etch away the silicon germanium (SiGe) 320 from the center of the emitter 410. The removal of the silicon germanium (SiGe) 320 leaves only the polysilicon 310 along the walls and on the bottom of the emitter window 410. The silicon germanium etch (SiGe) etch process is a selective etch to the polysilicon 310. Although the selectivity of the selective etch process may not be perfect, it provides better process control than the timed etch process used in similar prior art processes. The result of applying the etch procedure is shown in the structure 700 in FIG. 7.

Then a salicide procedure (a self aligned silicidation procedure) is performed to place a salicide layer 810 on the polysilicon 310 on the bottom of the emitter window 210. The salicide procedure also places a salicide layer 81-0 on the polysilicon base structures 130 of the raised external base. In an advantageous embodiment of the invention, a thickness of the salicide layer 810 ranges from approximately twenty nanometers (20 nm) to approximately thirty nanometers (30 nm). The result of applying the salicide procedure is shown in the structure 800 in FIG. 8.

Then a first contact structure 910 (e.g., tungsten 910) is formed to provide an electrical contact to the top surface of the salicide layer 810 and to the polysilicon 310 in the emitter window 210. Then a second contact structure 920 (e.g., tungsten 910) is formed to provide an electrical contact to the first contact structure 910. The result of forming the contact structures 910 and 920 is shown in the structure 900 in FIG. 9. In an advantageous embodiment of the invention, a thickness of the polysilicon emitter 310 is approximately fifty nanometers (50 nm).

The system and method of the present invention provides several significant advantages. The present invention provides a self aligned heterojunction bipolar transistor that has a reduced emitter resistance. This is because the thickness of the polysilicon emitter 310 in the polyemit module is reduced to a thickness of approximately fifty nanometers (50 nm). This compares to prior art values of approximately two hundred fifty nanometers (250 nm) to three hundred nanometers (300 nm). In addition, the contact area between the polysilicon emitter 310 and the contact structure 910 is increased to more than three (3) times a similar contact in prior art polyemit modules.

The present invention also provides an additional advantage in that the emitter etch back process of the invention is a selective etch process. This provides a better process control than the timed etch process that is used in prior art processes.

Figure 8:
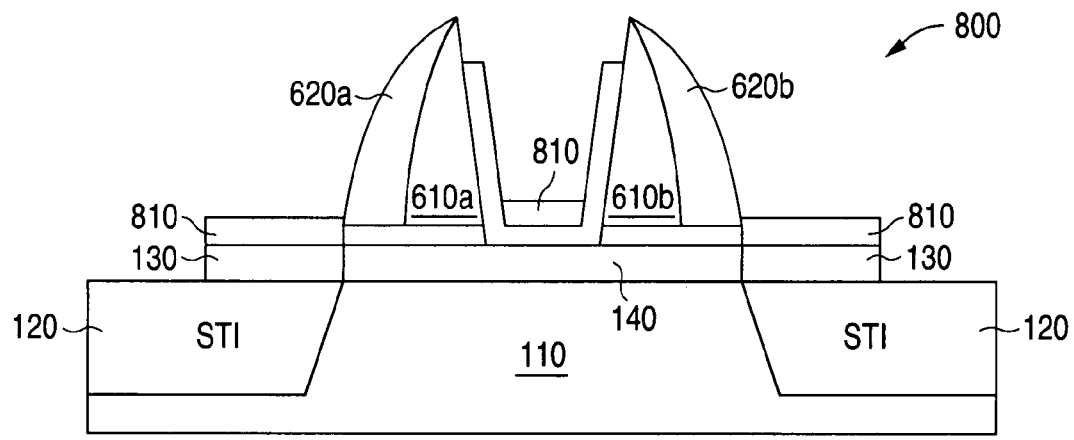
Figure 9:
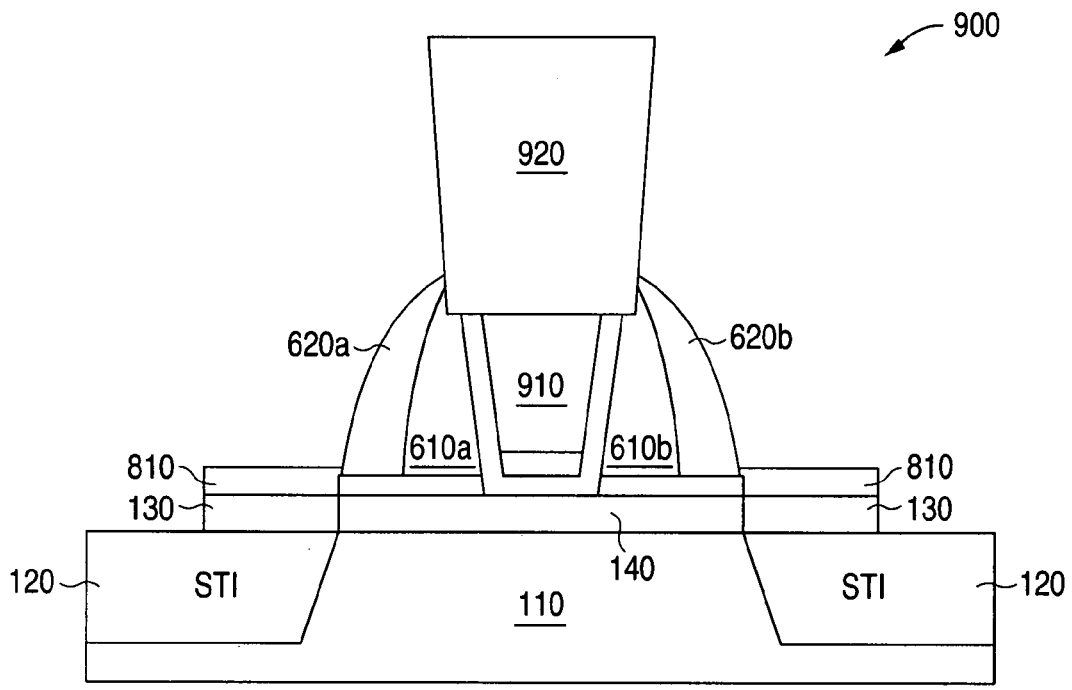
Figure 10:
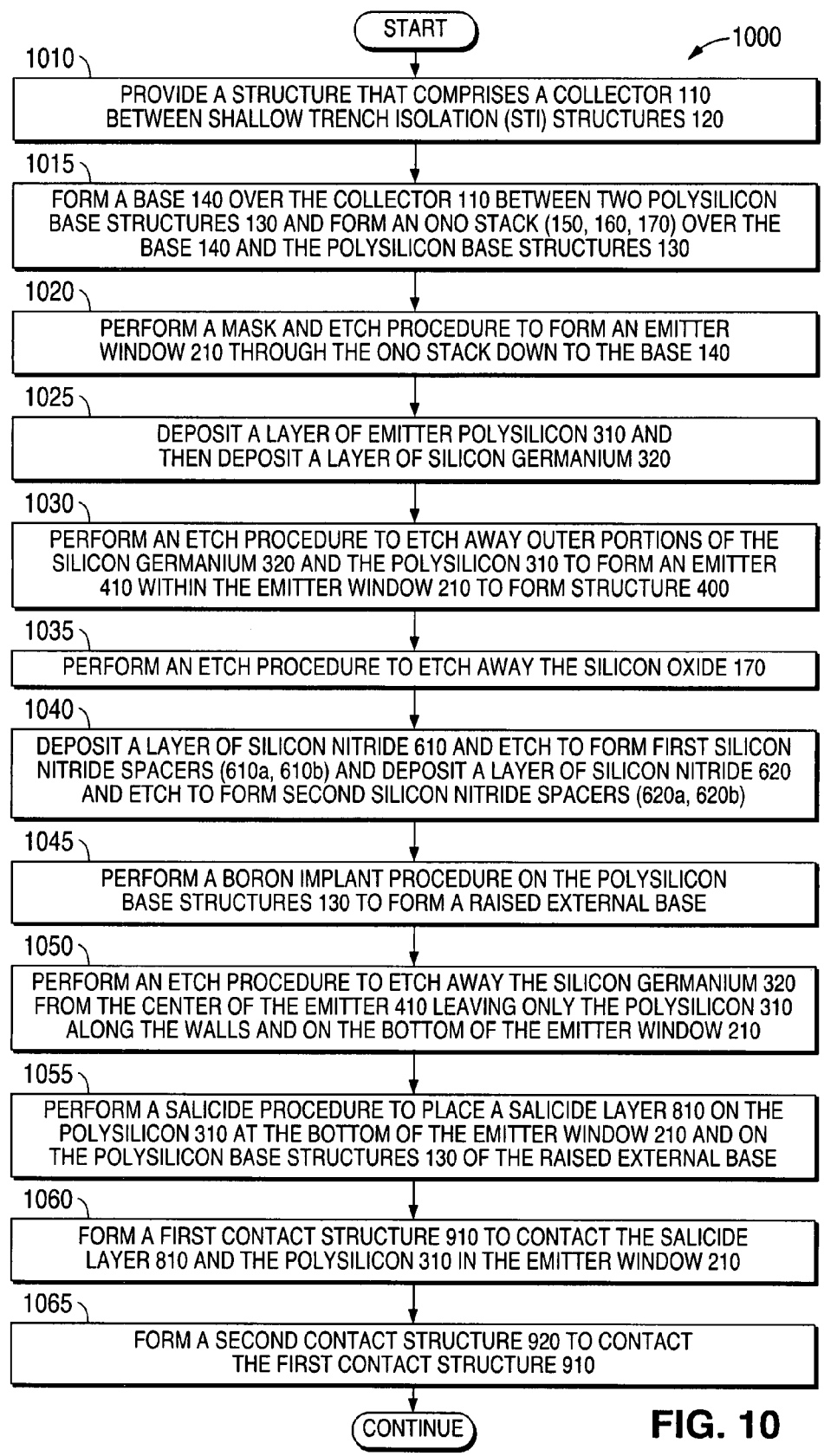
FIG. 10 illustrates a flow chart showing the steps of an advantageous embodiment of a method of the present invention.

FIG. 8 illustrates a flow chart showing the steps of an advantageous embodiment of a method of the present invention. In the first step of the method a structure is provided that comprises a collector 110 between shallow trench isolation (STI) structures 120 (step 1010). Then a base 140 is formed over the collector 110 between two polysilicon base structures and a silicon oxide/silicon nitride/silicon oxide (ONO) stack (150, 160, 170) is formed over the base 140 and over the polysilicon base structures 130 (step 1015).

Then a mask and etch procedure is performed to form an emitter window 210 through the ONO stack down to the base 140 (step 1020). Then a layer of emitter polysilicon 310 is deposited over the resulting structure and a layer of silicon germanium (SiGe) is deposited over the layer of emitter polysilicon 310 (step 1025).

Then an etch procedure is performed to etch away outer portions of the silicon germanium (SiGe) 320 and the emitter polysilicon 310 to form an emitter 410 within the emitter window 210 to form structure 400 (step 1030). Then an etch procedure is performed to etch away the silicon oxide 170 of the ONO stack (step 1035).

Then a layer of silicon nitride 610 is deposited and etched to form first silicon nitride spacers (610a and 610b). Then another layer of silicon nitride 620 is deposited and etched to form a second silicon nitride spaces (620a and 620b) (step 1040). Then a boron implant procedure is performed on the polysilicon base structures 130 to form a raised external base (step 1045).

Then an etch procedure is performed to etch away the silicon germanium (SiGe) 320 from the center of the emitter 410 leaving only the polysilicon 310 along the walls and on the bottom of the emitter window 210 (step 1050). Then a salicide procedure is performed to place a salicide layer 810 on the polysilicon 310 at the bottom of the emitter window 210 and on the polysilicon base structures 130 of the raised external base (step 1055).

Then a first contact structure 910 is formed to contact the salicide layer 810 and the polysilicon 310 in the emitter window 210 (step 1060). Then a second contact structure 920 is formed to contact the first contact structure 910 (step 1065).

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method of manufacturing a self aligned silicon germanium heterojunction bipolar transistor having a polyemit module, the method comprising the steps of:
   forming a base over a collector and between at least two base structures;
   forming a first oxide/nitride/second oxide (ONO) stack over the base, wherein the second oxide is thicker than the first oxide;
   forming an emitter window through the ONO stack down to the base;
   depositing a layer of emitter silicon over the structure and in the emitter window;
   depositing a layer of silicon germanium (SiGe) over the layer of emitter silicon and in the emitter window;
   etching outer portions of the layer of SiGe and the layer of emitter silicon to form an emitter;
   forming at least one nitride spacer adjacent to the emitter;
   etching the layer of SiGe from a central portion of the emitter to expose the layer of emitter silicon; and
   performing a salicide procedure to place a salicide layer over the layer of emitter silicon and over the at least two base structures.

2. The method as claimed in claim 1 further comprising the step of:
   forming the layer of emitter silicon to have a thickness of approximately fifty nanometers.

3. The method as claimed in claim 2 wherein the thickness of approximately fifty nanometers of the layer of emitter silicon provides a reduction in a resistance of the polyemit module.

4. The method as claimed in claim 1 further comprising the steps step of:
   forming the layer of emitter silicon in contact with the emitter window.

5. The method as claimed in claim 4 further comprising the steps step of:
   forming a bottom of the emitter window with a width of approximately one hundred fifty nanometers.

6. The method as claimed in claim 1 wherein the layer of emitter silicon comprises one of: a layer of monocrystalline silicon and a layer of polysilicon.

7. The method as claimed in claim 1 wherein a double layer deposition process is used to deposit the layer of emitter silicon and the layer of silicon germanium, the layer of silicon germanium comprising a sacrificial layer of silicon germanium 8. The method as claimed in claim 7 further comprising the step of:
   removing the sacrificial layer of silicon germanium with a selective etch process.

9. The method as claimed in claim 1 further comprising the steps step of:
   forming the layer of emitter silicon in contact with the emitter window so that the layer of emitter silicon is adjacent to walls and a bottom of the emitter window so that the layer of emitter silicon forms a U-shaped structure.

10. The method as claimed in claim 9 further comprising the steps of:
    providing a contact structure to contact the layer of emitter silicon; and
    placing the contact structure in contact with sides and a bottom of the U-shaped structure of the layer of emitter silicon.

11. A self aligned silicon germanium heterojunction bipolar transistor comprising:
    a collector having a thicker central portion and a thinner outer portion;
    a base over the central portion of the collector;
    a first oxide/nitride/second oxide (ONO) stack over the base, wherein the second oxide is thicker than the first oxide, and wherein the ONO stack comprises an emitter window;
    a layer of emitter silicon over the base and within the emitter window; and
    a salicide layer over the layer of emitter silicon at a bottom of the emitter window;
    wherein the transistor comprises a polyemit module that comprises the layer of emitter silicon, the layer of emitter silicon comprises a first layer of a double layer deposition process, a second layer in the double layer deposition process comprises a sacrificial layer of silicon germanium and the sacrificial layer of silicon germanium is removed with a selective etch process.

12. The self aligned silicon germanium heterojunction bipolar transistor as claimed in claim 11 wherein the layer of emitter silicon has a thickness of approximately fifty nanometers.

13. The self aligned silicon germanium heterojunction bipolar transistor as claimed in claim 12 wherein the thickness of approximately fifty nanometers of the layer of emitter silicon provides a reduction in a resistance of the polyemit module.

14. The self aligned silicon germanium heterojunction bipolar transistor as claimed in claim 11 wherein the layer of emitter silicon is in contact with the emitter window.

15. The self aligned silicon germanium heterojunction bipolar transistor as claimed in claim 14 wherein the bottom of the emitter window has a width of approximately one hundred fifty nanometers.

16. The self aligned silicon germanium heterojunction bipolar transistor as claimed in claim 11 wherein the layer of emitter silicon comprises one of: a layer of monocrystalline silicon and a layer of polysilicon.

17. The self aligned silicon germanium heterojunction bipolar transistor as claimed in claim 11 wherein:

the layer of emitter silicon is in contact with the emitter window so that the layer of emitter silicon is adjacent to walls and the bottom of the emitter window so that the layer of emitter silicon forms a U-shaped structure.

18. The self aligned silicon germanium heterojunction bipolar transistor as claimed in claim 17 further comprising:

a contact structure that is in contact with sides and a bottom of the U-shaped structure of the layer of emitter silicon.

19. The self aligned silicon germanium heterojunction bipolar transistor as claimed in claim 12 wherein the layer of emitter silicon is in contact with the emitter window.

20. The self aligned silicon germanium heterojunction bipolar transistor as claimed in claim 19 wherein the bottom of the emitter window has a width of approximately one hundred fifty nanometers.

* * * * *